(12) United States Patent
Lee

(10) Patent No.: US 8,400,813 B2
(45) Date of Patent: Mar. 19, 2013

(54) ONE-TIME PROGRAMMABLE FUSE WITH ULTRA LOW PROGRAMMING CURRENT

(75) Inventor: Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 483 days.

(21) Appl. No.: 12/617,363

(22) Filed: Nov. 12, 2009

(65) Prior Publication Data

US 2010/0202184 A1 Aug. 12, 2010

Related U.S. Application Data

(60) Provisional application No. 61/151,382, filed on Feb. 10, 2009.

(51) Int. Cl.
*G11C 17/00* (2006.01)

(52) U.S. Cl. ............... 365/96; 365/177; 365/189.07; 365/189.09

(58) Field of Classification Search ............ 365/96, 365/177, 198.07, 189.09
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,110,313 B2 | 9/2006 | Huang | |
| 7,190,050 B2 | 3/2007 | King et al. | |
| 7,247,887 B2 | 7/2007 | King et al. | |
| 7,265,008 B2 | 9/2007 | King et al. | |
| 7,307,880 B2 | 12/2007 | Ko et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 2004/0233768 A1* | 11/2004 | Kothandaraman | 365/232 |
| 2005/0153490 A1 | 7/2005 | Yoon et al. | |
| 2007/0029576 A1* | 2/2007 | Nowak et al. | 257/209 |
| 2007/0120156 A1 | 5/2007 | Liu et al. | |
| 2007/0122953 A1 | 5/2007 | Liu et al. | |
| 2007/0122954 A1 | 5/2007 | Liu et al. | |
| 2007/0128782 A1 | 6/2007 | Liu et al. | |
| 2007/0132053 A1 | 6/2007 | King et al. | |
| 2007/0258311 A1* | 11/2007 | Kushida | 365/225.7 |
| 2008/0165586 A1* | 7/2008 | Matsufuji et al. | 365/185.23 |
| 2008/0290470 A1 | 11/2008 | King et al. | |
| 2008/0296632 A1 | 12/2008 | Moroz et al. | |
| 2009/0084181 A1* | 4/2009 | Kolb et al. | 73/514.16 |
| 2009/0181477 A1 | 7/2009 | King et al. | |

* cited by examiner

*Primary Examiner* — Hoai V Ho
(74) *Attorney, Agent, or Firm* — Slater & Matsil, L.L.P.

(57) ABSTRACT

A method of operating a FinFET fuse includes providing the FinFET fuse including a drain, a gate, a source, and a channel between the drain and the source; and applying a program voltage to one of the source and the drain of the FinFET fuse to cause a punch-through in the channel of the FinFET fuse. The method further includes determining a program state of the FinFET fuse.

20 Claims, 3 Drawing Sheets

ONE-TIME PROGRAMMABLE FUSE WITH ULTRA LOW PROGRAMMING CURRENT

This application claims the benefit of U.S. Provisional Application No. 61/151,382 filed on Feb. 10, 2009, entitled "One-Time Programmable Fuse with Ultra Low Programming Current," which application is hereby incorporated herein by reference.

TECHNICAL FIELD

This invention relates generally to one-time programmable fuses, and more particularly to a method of using FinFETs as fuses.

BACKGROUND

In the semiconductor industry, fuse elements are widely used features in integrated circuits for a variety of purposes, such as improving manufacturing yields or customizing generic integrated circuits. For example, by replacing defective circuits on chips with redundant circuits on the same chips, manufacturing yields can be significantly increased. A fuse disconnected by a laser beam is referred to as a laser fuse, while a fuse disconnected by passing an electrical current, or blowing, is referred to as an electrical fuse, or e-fuse. By selectively blowing fuses within an integrated circuit that has multiple potential uses, a generic integrated circuit design may be economically manufactured and adapted to a variety of custom uses.

Typically, fuses are incorporated in the design of integrated circuits, wherein the fuses are selectively blown, for example, by passing an electrical current of a sufficient magnitude to cause electro-migration or melting, thereby creating a more resistive path or an open circuit. Alternatively, a current that is weaker than the current required to entirely blow the fuse can be applied to the fuse in order to degrade the fuse, thus increasing the resistance of the fuse. The process of selectively blowing or degrading fuses is often referred to as "programming".

Conventional fuses are often formed of narrow polysilicon lines or metal lines. In order to reduce the programming currents, the fuses are preferably made as narrow (and thin) as possible. The reduced dimensions of the fuses can tend to increase variation in the programming currents between fuses because the effect of dimensional variations in the fabrication process becomes relatively larger as the size of the fuses decreases. Further, the grain sizes and structures in the polysilicon fuses also affect the programming currents of polysilicon fuses. As a result, the programming currents of conventional fuses may vary over a wide range.

Further, conventional current-programmed fuses suffer from inadvertent programming caused by electro-static discharge currents, which may reach a very high level in a short period of time. New electrical fuses are thus needed to solve the above-discussed problems.

SUMMARY OF THE INVENTION

In accordance with one aspect of the present invention, a method of operating a FinFET fuse includes providing the FinFET fuse including a drain, a gate, a source, and a channel between the drain and the source; and applying a program voltage to one of the source and the drain of the FinFET fuse to cause a punch-through in the channel of the FinFET fuse. The method further includes determining a program state of the FinFET fuse.

In accordance with another aspect of the present invention, a method of operating a FinFET fuse includes providing the FinFET fuse including a drain, a gate, and a gate dielectric; turning off the FinFET fuse by applying a low voltage to the gate; and at a time the FinFET fuse is turned off, applying a program voltage to one of the source and the drain of the FinFET fuse to cause a punch-through of the FinFET fuse. The gate dielectric is not broken down by the program voltage. The method further includes determining a program state of the FinFET fuse.

In accordance with yet another aspect of the present invention, a method of operating a FinFET fuse includes providing the FinFET fuse; providing a reference FinFET fuse, wherein a program state of the reference FinFET fuse is pre-determined; applying a first gate voltage to a gate of the reference FinFET fuse; determining a first drain voltage of a drain of the reference FinFET fuse; applying a second gate voltage to a gate of the FinFET fuse; determining a second drain voltage of a drain of the FinFET fuse; and comparing the first drain voltage and the second drain voltage to determine a program state of the FinFET fuse.

In accordance with yet another aspect of the present invention, an integrated circuit includes a first FinFET transistor including a first drain, a first gate, and a first source; and a programming node selected from the group consisting essentially of an output of a charge pump and an external pad. One of the first source and the first drain of the first FinFET transistor is coupled to the programming node.

In accordance with yet another aspect of the present invention, an integrated circuit includes a first FinFET transistor including a first drain, a first gate, and a first source; a second FinFET transistor including a second drain, a second gate, and a second source, wherein the first FinFET transistor is substantially identical to the second FinFET transistor; a programming node selected from the group consisting essentially of an output of a charge pump and an external pad, wherein the first drain of the first FinFET transistor is coupled to the programming node; and a state-determining circuit. The state-determining circuit includes a first input coupled to the first drain; a second input coupled to the second drain; and an output. The state-determining circuit is configured to compare a first voltage at the first input and a second voltage at the second input, and output a voltage based on relative magnitudes of the first voltage and the second voltage.

In accordance with yet another aspect of the present invention, an integrated circuit structure includes a FinFET fuse array, which includes a plurality of FinFET fuses arranged into rows and columns. Each of the FinFET fuses comprises a first source/drain region, a second source/drain region, and a gate. A plurality of word lines extends in a row direction of the FinFET fuse array, with each of the plurality of word lines connected to first source/drain regions of all FinFET fuses in a same row. A plurality of bit lines extends in a column direction of the FinFET fuse array, with each of the plurality of bit lines connected to second source/drain regions of all FinFET fuses in a same column. A plurality of read lines extends in the column direction with each of the plurality of read lines connected to the gates of all FinFET fuses in a same column.

The advantageous feature of the present invention includes using voltage programming instead of current programming to program the fuse, and hence the FinFET fuse is less prone to inadvertent programming caused by electrostatic discharging (ESD) current.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
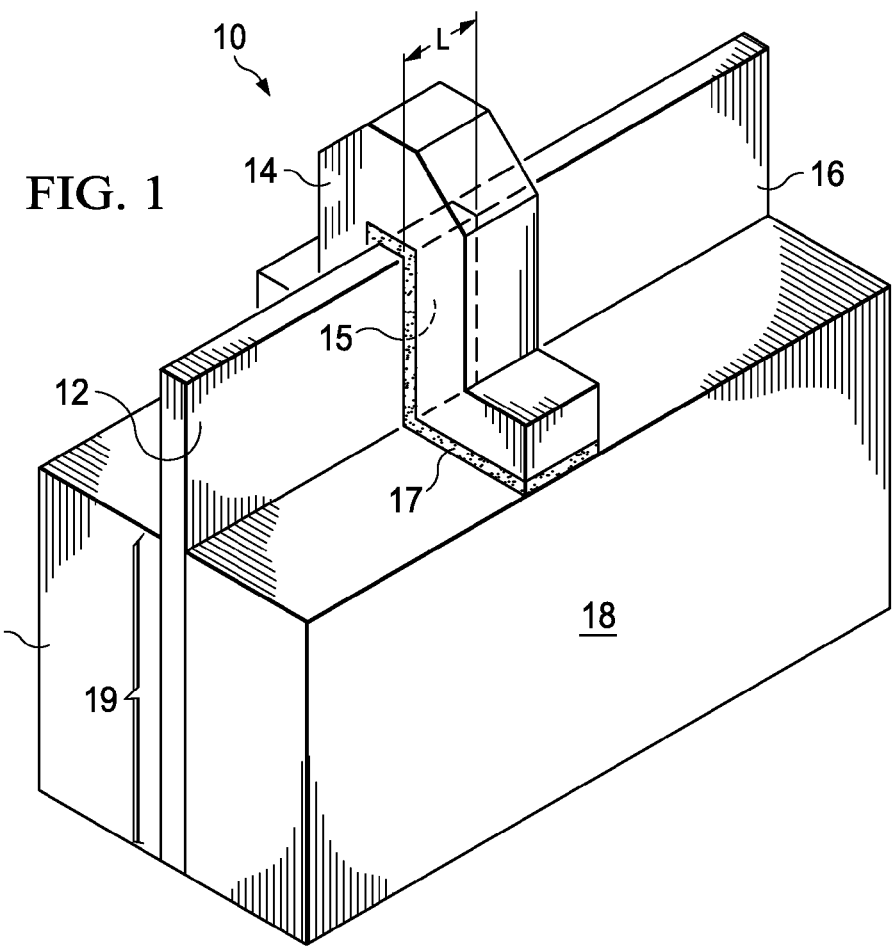
FIG. 1 illustrates a perspective view of an embodiment of a FinFET fuse in accordance with the invention.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method of using FinFETs as one-time programmable (OTP) fuse elements is provided. The structures and the operation of the FinFET fuses are discussed. The variations of the FinFET fuses are also discussed. Throughout the various views and illustrated embodiments, like reference numerals are used to indicate like elements. Please note that the source and drain of a FinFET fuse may be interchangeable, depending on how the FinFET fuses are connected in the circuit, and whether the FinFET fuses are PMOS or NMOS devices.

FIG. 1 illustrates a perspective view of an exemplary FinFET transistor 10, which is used as a fuse, and hence is referred to as FinFET fuse 10 throughout the description. FinFET fuse 10 has drain 12, gate 14, source 16, gate dielectric 17, and channel 15 between drain 12 and source 16. Drain 12, source 16 and channel 15 are portions of a fin over insulation region 18, which may be, for example, a shallow trench isolation region. The fin that forms drain 12, channel 15 and source 16 may be connected to a semiconductor region 19 that is between separate portions of insulation region 18. Alternatively, the fin may reside on insulation region 18, with semiconductor region 19 also being a part of insulation region 18, instead of a semiconductor region.

Figure 2:
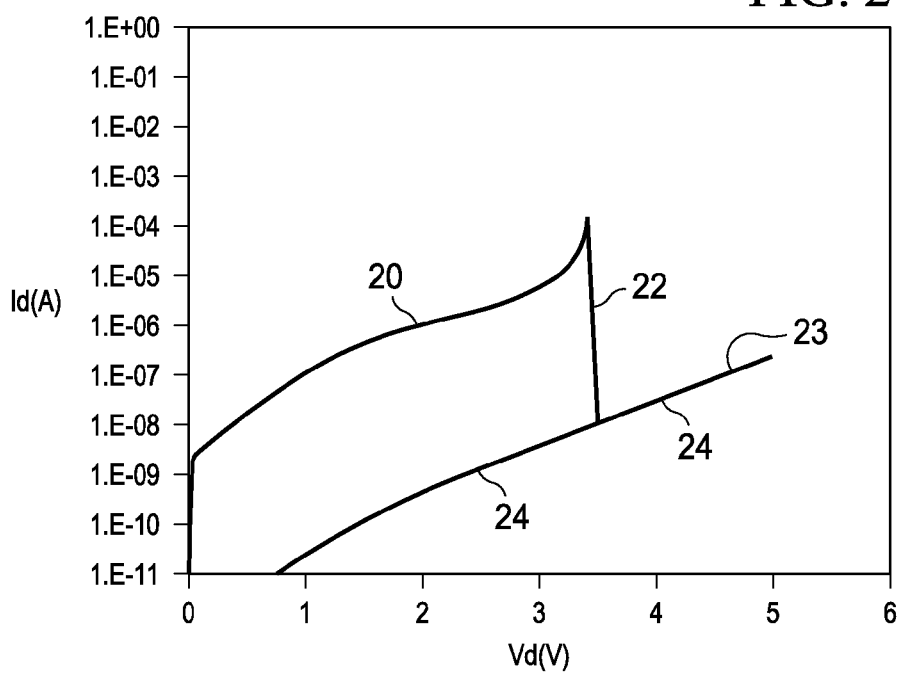
FIG. 2 illustrates I-V curves of a FinFET fuse before and after programming, wherein drain currents are shown as functions of drain voltages.

FIG. 2 illustrates an I-V curve showing how FinFET fuse 10 behaves when used as a fuse, wherein drain currents Id are shown as functions of drain voltages Vd. The exemplary FinFET fuse 10 is an NMOS fuse, although similar behavior may be found in PMOS FinFET fuses also. The I-V curves are obtained with both source region 16 and gate 14 grounded. Accordingly, the drain currents Id are leakage currents.

As shown by curve 20, initially, FinFET fuse 10 is not programmed. Drain voltage Vd is initially low, for example, 0V, and hence (substantially) no drain current flows. By gradually increasing drain voltage Vd, curve 20 is obtained. With the increase in drain voltage Vd, it is observed that drain current Id increases as well. However, when drain voltage Vd reaches a threshold voltage, for example, about 3.3 V in the illustrated example, a punch-through occurs, which is very likely in channel region 15 (refer to FIG. 1), and drain current Id significantly decreases (curve 22). The process for applying an adequate drain voltage Vd to induce the punch-through is accordingly referred to as the "programming" of FinFET fuse 10. When the drain voltage Vd further increases, drain current Id increases again (curve 23), however, at a level lower than that of curve 20. Please note that since FinFET fuse 10 is programmed by applying a voltage across the source and the drain, the gate dielectric 17 (refer to FIG. 1) of FinFET fuse 10 is not broken down.

Curve 24 illustrates the I-V curve obtained from FinFET fuse 10 after the punch-through occurs. It is noted that with a small drain voltage Vd applied, the drain current Id is extremely small. This is partially caused by the punch-through of the channel region, which results in the physical disruption of the current path in the channel region. With the increase in the drain voltage Vd, the drain current Id increases (curve 24). However, the drain current Id after punch-through is significantly lower (curve 23) than the drain current before the punch-through occurs (curve 20). In an exemplary embodiment, the drain current Id after the punch-through may be as much as three orders of magnitude lower than before the punch-through. This significant difference may be used to distinguish the program state of FinFET fuse 10, as will be discussed in detail in subsequent paragraphs. Throughout the description, the term "program state" refers to whether a punch-through has occurred to the FinFET fuse 10 or not, and the FinFET fuses that have not experienced punch-through are referred to as un-programmed FinFET fuses. The programming of FinFET fuses is irreversible, and the FinFET fuses that may be programmed using the above-discussed scheme are one-time programmable (OTP) fuses.

Figure 3:
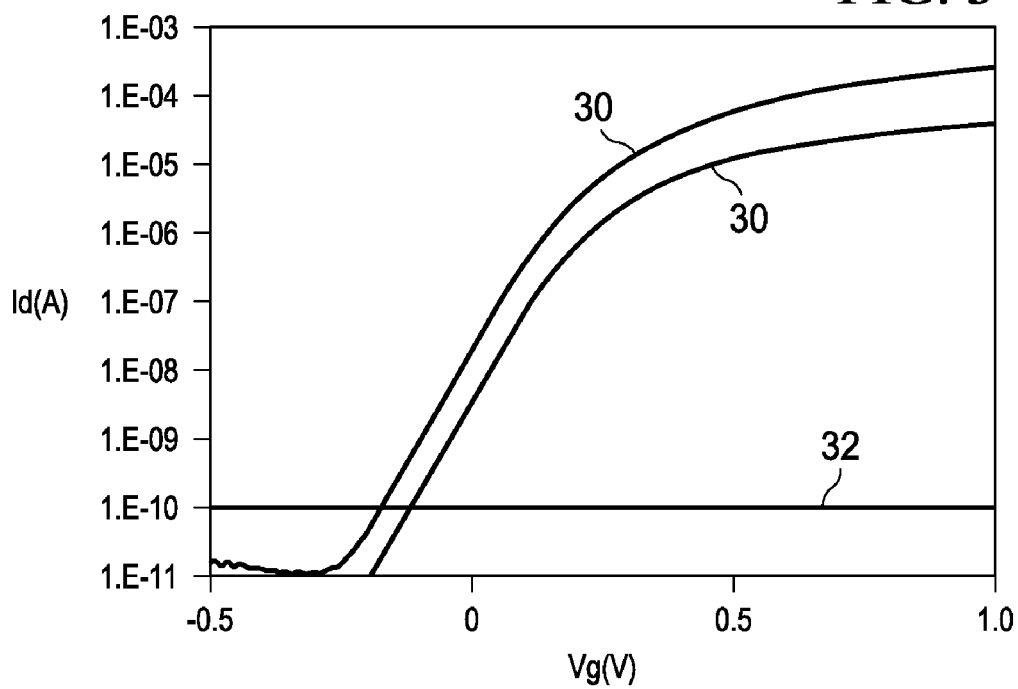
FIG. 3 illustrates I-V curves of a FinFET fuse before and after programming, wherein drain currents are shown as functions of gate voltages.

FIG. 3 illustrates additional I-V curves, wherein drain currents Id are shown as functions of gate voltages Vg. The I-V curves of two FinFET fuse samples are illustrated, wherein curves 30 are the I-V curves of un-programmed FinFET fuses, each corresponding to one of the FinFET fuse samples, and line 32 (which actually includes two lines overlapping each other) indicates the I-V curves of the FinFET fuse samples after being programmed. It is noted that before programming increasing the gate voltages Vg causes the FinFET fuse samples begin to be turned on, which results in the drain currents Id significantly increasing (curve 30). However, after programming, the channels of the FinFET fuse samples have been punched through. Therefore, even if the gate voltages of the FinFET fuse samples are greater than their pre-programming threshold voltages, there is still only a negligible drain current Id (line 32). In FIG. 3, lines 30 correspond to drain voltages Vd of less than about 1V, for example, close to 0.85V. Line 32, which is a substantially straight line unaffected by the gate voltages Vg, represents the leakage current of the programmed FinFET fuse samples, wherein the drain voltage Vd of the FinFET fuse corresponding to line 32 may be between about 0.85V and about 1V. In an exemplary embodiment, the drain voltage Vd is about 1.5V. Similarly, the behavior shown in FIG. 3 can be used to distinguish whether a FinFET fuse has been programmed or not. The method for determining the program state of FinFET fuse 10 may include programming a reference FinFET fuse (not shown, may have an identical structure as FinFET fuse 10), determining the leakage current (line 32, referred to as reference leakage current hereinafter) of the reference FinFET fuse after its programming, and applying gate voltages to turn on FinFET fuse 10 and measuring its drain current. The drain current may thus be compared to the current level of line 32. Clearly, with a gate voltage greater than the threshold voltage, if the drain current is significantly greater than the reference leakage current 32, the FinFET fuse is not programmed. Otherwise, if the drain current is at a same or a similar order as the reference leakage current 32, the FinFET fuse is programmed.

Figure 4:
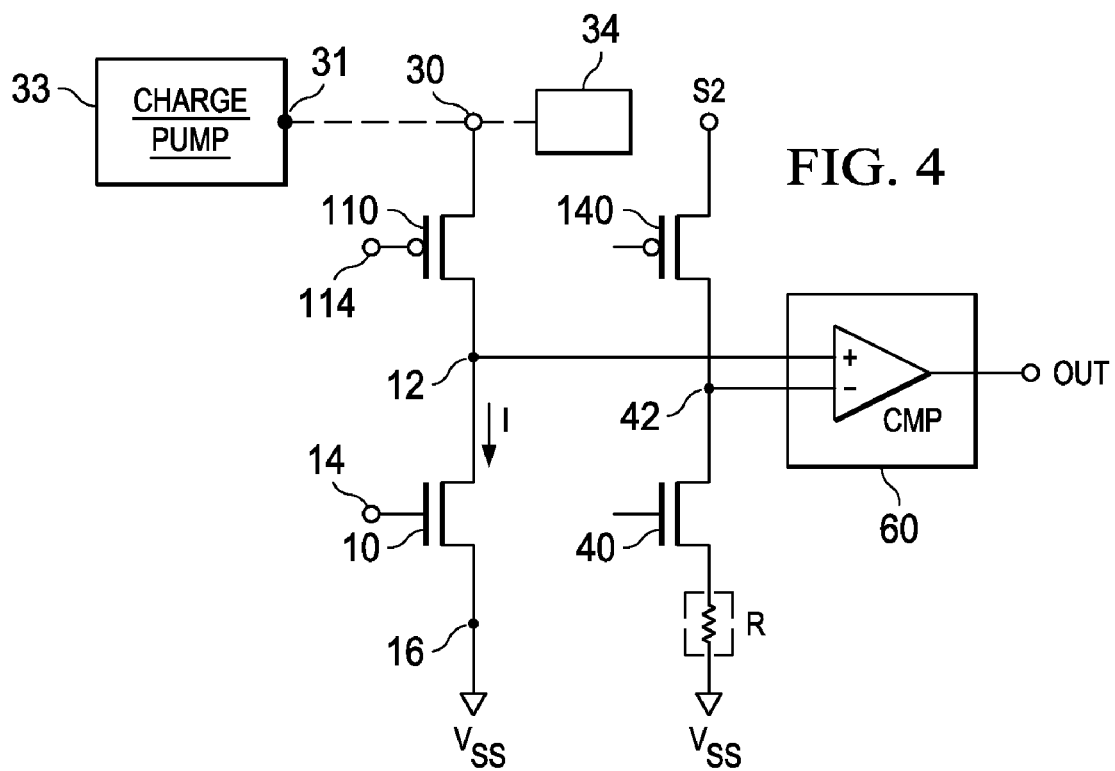
FIGS. 4 and 5 illustrate exemplary program and read circuits for a FinFET fuse.

FIG. 4 illustrates an exemplary program and read circuit, which may be used for programming and determining/reading the program state of FinFET fuse 10. The program and read circuit includes FinFET fuse 10, control transistor 110, reference FinFET fuse 40, and reference control transistor 140. The source of control transistor 110 is further coupled to node 30, which may act as a programming node. It is realized that the voltage required for programming FinFET fuse 10 may be higher than the operation voltage of the respective integrated circuit, which operation voltage may be a core circuit operation voltage or an input/output (I/O) operation voltage. Therefore, node 30 needs to have a high program voltage (for example, about 3.3 volts or higher) in order to program FinFET fuse 10. In an embodiment of the present invention, node 30 is connected to charge pump 33, which drives up the operation voltage of the respective circuit to a level high enough for programming FinFET fuse 10. The applicable structure of charge pump 33 is well known in the art, and hence is not provided herein. In alternative embodiments, instead of using a built-in charge pump to supply the program voltage, node 30 is connected to an external pad 34, which may be exposed to the surface of the respective semiconductor chip (in which the structure shown in FIG. 4 is located). External pad 34 may also be connected to the external pin (not shown) of the chip package.

The programming of FinFET fuse 10 is controlled by control transistor 110. Preferably, for the ease and the reliability of FinFET fuse 10, the size (for example, the channel length of channel 15, refer to FIG. 1) of FinFET fuse 10 is preferably as small as possible, which is preferably the minimum size allowed by the formation technology. For example, in the case the structure shown in FIG. 4 is manufactured using 32 nm technology, the length L of channel 15 is preferably about 24 nm. On the other hand, control transistor 110 preferably has a size (for example, the channel length, not shown) greater than the minimum size, so that when no programming is to be performed to FinFET fuse 10, even if the program voltage is applied to node 30, control transistor 110 will not be programmed. This situation may also occur when other FinFET fuses connected in parallel with FinFET fuse 10 need to be programmed. Control transistor 110 may be a FinFET transistor or a planar transistor.

When a program operation needs to be performed to FinFET fuse 10, a program voltage high enough to cause the punch-through of FinFET fuse 10 is applied to node 30. The program voltage may be provided by output 31 of charge pump 33, or input through external pad 34. A voltage is applied to gate 114 of control transistor 110 to turn it on. In the preferred embodiment, gate 14 of FinFET fuse 10 is grounded or applied with a low voltage lower than the threshold voltage to keep FinFET fuse 10 at an "off" state. Throughout the description, the term "low voltage" refers to a voltage that is not high enough to turn on the FinFET fuses. Preferably, the low voltages are lower than about 0.2V, and more preferably less than about 0.1V. One skilled in the art will realize, however, that "low voltage" is a term of art, and may have different values depending on the structure and technology generations of the respective FinFET fuses. In alternative embodiments, when the programming is performed, gate 14 of FinFET fuse 10 is applied with a voltage, for example, higher than its threshold voltage, to keep FinFET fuse 10 at an "on" state. In yet other embodiments, when the programming is performed, gate 14 of FinFET fuse 10 may be floating. The program voltage is applied to drain 12 of FinFET fuse 10, and hence FinFET fuse 10 is programmed. Conversely, if no programming is to be performed to FinFET fuse 10, gate 114 of control transistor 110 is applied with a high voltage, so that control transistor 110 is off. Accordingly, the voltage applied to drain 12 of FinFET fuse 10 is not high enough for the programming to occur.

To determine the program state of FinFET fuse 10, a gate voltage may be applied to gate 14 of FinFET fuse 10, wherein the gate voltage may be substantially equal to or greater than the threshold voltage of FinFET fuse 10. Drain current I may then be measured. As provided in FIG. 3, if FinFET fuse 10 is programmed, drain current I will be very low, otherwise, drain current I will be high. For the purpose of reading the state of FinFET fuse 10, it is to be noted that the drain voltage Vd should be low enough so that the reading will not cause the advertent programming of FinFET fuse 10. Clearly, drain voltage Vd for the reading is lower than drain voltage Vd for the programming of FinFET fuse 10. In an exemplary embodiment, drain voltages Vd of FinFET fuse 10 (and/or drain-to-source voltage) in readings are lower than about 1.8V.

Alternatively, state detector 60 may be used to determine the program state of FinFET fuse 10. In this case, a reference FinFET fuse 40, which is preferably, although not required to be, substantially identical to FinFET fuse 10, is connected to a reference control transistor 140, which is also preferably, although not required to be, substantially identical to control transistor 110. The reference FinFET fuse 40 is preferably un-programmed, although it can also be programmed. An optional resistor R may be added to adjust the voltage at node 42.

When a read operation is performed, control transistor 110 and reference control transistor 140 are both turned on by applying voltages to their gates. A same voltage may be applied to nodes 30 and 52. Voltages greater than the respective threshold voltages of FinFET fuses 10 and 40 are applied to their gates, wherein the gate voltage applied to FinFET fuse 10 is preferably equal to the gate voltage of reference FinFET fuse 40. The voltage at node 42 is fixed due to the fixed program state of reference FinFET fuse 40. The voltage at node 12 (the drain of FinFET fuse 10), on the other hand, is determined by the program state of FinFET fuse 10, and is low when FinFET fuse 10 is not programmed, and is high when FinFET fuse 10 is programmed. The circuit as shown in FIG. 4 may be further adjusted, for example, by adding resistor R, so that when FinFET fuse 10 is not programmed, the voltage at node 12 is lower than the voltage at node 42, and when FinFET fuse 10 is programmed, the voltage at node 12 is higher than the voltage at node 42. State detector 60 may be pre-configured so that it outputs a first voltage at node OUT when the voltage at node 12 is higher than the voltage at node 42, and outputs a second voltage different from the first voltage at node OUT when the voltage at node 12 is lower than the voltage at node 42.

In an exemplary embodiment, state detector 60 includes an operational amplifier comparator CMP, which has a positive input and a negative input, with one coupled to node 12, and the other coupled to node 42. One skilled in the art will realize the operation of the operational amplifier comparator CMP.

Figure 5:
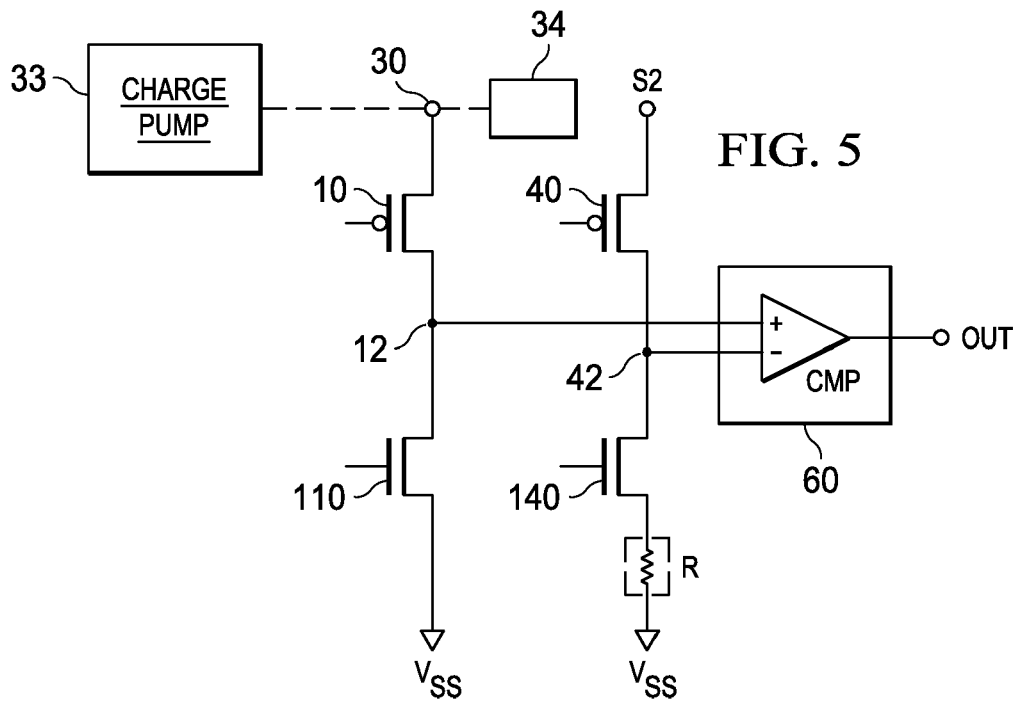

In FIG. 4, FinFET fuse 10 is an n-type FinFET fuse. In alternative embodiments, FinFET fuse 10 may be of p-type. The respective program and read circuit is shown in FIG. 5, wherein like reference numerals in FIG. 4 are used to indicate like elements in FIG. 5. One skilled in the art, with the teaching provided in the preceding paragraphs, will realize the operation details. In this case, however, the programming on FinFET fuse 10 is performed by applying the program voltage to the source of FinFET fuse 10, as is shown in FIG. 5.

Figure 6:
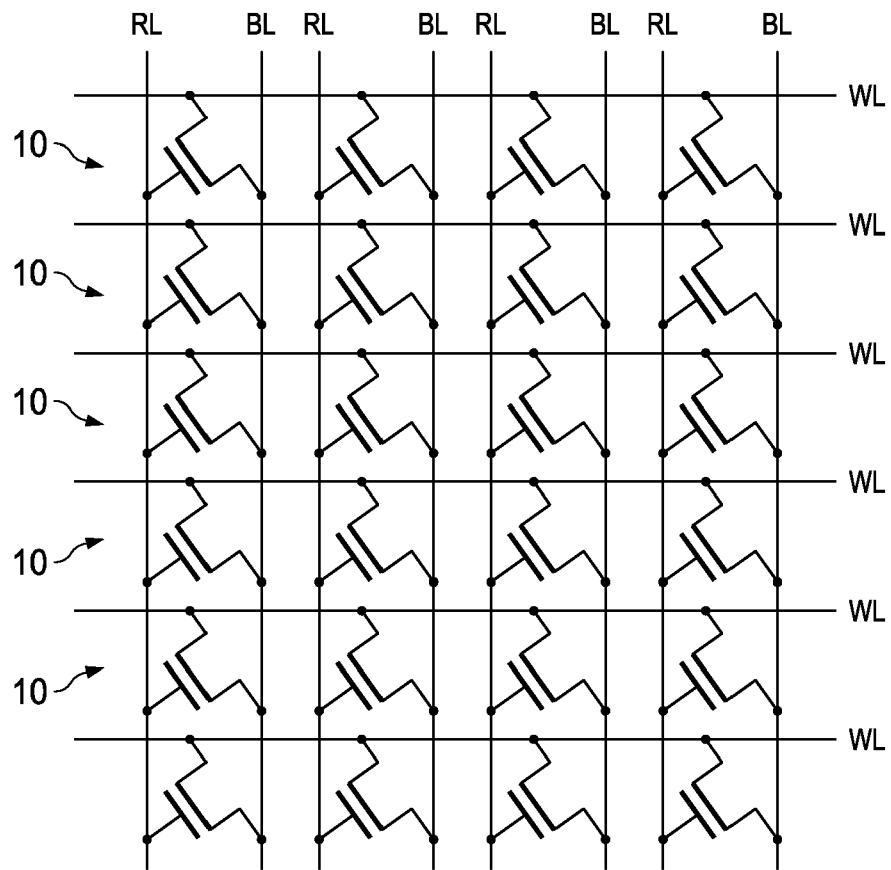
FIG. 6 illustrates an exemplary OTP array comprising FinFET fuses.

The usage of the FinFET fuses is not limited to single bit applications. FinFET fuses may also form an OTP array as shown in FIG. 6. With the OTP array, mass data may be programmed into the FinFET fuse array. The FinFET fuse array includes a plurality of FinFET fuses 10 arranged into rows and columns. Each FinFET fuse 10 has a gate connected to one read line RL, a first source/drain region connected to one word line WL, and a second source/drain region connected to one bit line BL. Through the selection of different combinations of read lines RL, word lines WL, and bit lines BL, different FinFET fuses 10 may be programmed and read selectively.

The embodiments of the FinFET fuses have several advantageous features. First, the programming of FinFET fuses is voltage based. Since it is easier to cap electro-static discharge (ESD) voltages (using diodes, clamps, or the like) than to cap ESD currents, the FinFET fuses are less prone to the inadvertent programming caused by ESD transients. Second, the manufacturing of the FinFET fuses and the respective program and read circuits are fully compatible with the existing integrated circuit manufacturing processes, and hence no additional process steps and masks are needed.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of programming a FinFET fuse, the method comprising:
   providing the FinFET fuse comprising a drain, a gate, a source, and a channel between the drain and the source; and
   applying a program voltage between the source and the drain of the FinFET fuse, and without applying a voltage to the gate of the FinFET fuse, to cause a punch-through in the channel of the FinFET fuse.

2. The method of claim 1 further comprising, at a time the step of applying the program voltage is performed, turning off the FinFET fuse by applying a gate voltage lower than a threshold voltage of the FinFET fuse to the gate.

3. The method of claim 2, wherein the step of turning off the FinFET fuse comprises grounding the gate and a remaining one of the source and the drain.

4. The method of claim 2, wherein the step of turning off the FinFET fuse comprises keeping the gate floating.

5. The method of claim 1 further comprising determining a program state of the FinFET fuse.

6. The method of claim 5, wherein the step of determining the program state of the FinFET fuse comprises:
   providing a reference FinFET fuse;
   applying a first gate voltage to the gate of the FinFET fuse, and a second gate voltage to a gate of the reference FinFET fuse, wherein the first gate voltage and the second gate voltage are greater than threshold voltages of the FinFET fuse and the reference FinFET fuse, respectively; and
   comparing a drain voltage of the FinFET fuse to a drain voltage of the reference FinFET fuse.

7. The method of claim 5, wherein the step of determining the program state of the FinFET fuse comprises:
   applying a voltage between the drain and the gate of the FinFET fuse;
   determining a drain current of the FinFET fuse; and
   comparing the drain current with a pre-determined referenced leakage current.

8. The method of claim 1, wherein the step of applying the program voltage comprises:
   providing a charge pump; and
   generating the program voltage using the charge pump.

9. The method of claim 1, wherein the step of applying the program voltage comprises:
   providing an external pad and coupling the external pad to one of the source and the drain of the FinFET fuse; and
   applying the program voltage to the external pad.

10. The method of the claim 1, wherein the FinFET fuse is in a FinFET fuse array comprising a plurality of FinFET fuses arranged as rows and columns, and wherein the FinFET fuse array further comprises:
    a plurality of word lines parallel to each other, the plurality of word lines extending in a first direction;
    a plurality of read lines parallel to each other, the plurality of read lines extending in a second direction perpendicular to the first direction; and
    a plurality of bit lines parallel to each other, the plurality of bit lines extending in the second direction, wherein each of the plurality of FinFET fuses comprises:
       a gate connected to one of the plurality of read lines;
       a first source/drain region connected to one of the plurality of word lines; and
       a second source/drain region connected to one of the plurality of bit lines.

11. A method of programming a FinFET fuse, the method comprising:
    providing the FinFET fuse comprising a drain, a gate, a source, and a gate dielectric;
    turning off the FinFET fuse by applying a low voltage to the gate;
    at a time the FinFET fuse is turned off, applying a program voltage to one of the source and the drain of the FinFET fuse, and without applying a voltage to the gate of the FinFET fuse, to cause a punch-through of the FinFET fuse, wherein the gate dielectric is not broken down by the program voltage; and
    determining a program state of the FinFET fuse.

12. The method of claim 11, wherein the step of turning off the FinFET fuse comprises grounding a remaining one of the source and the drain, and grounding the gate of the FinFET fuse.

13. The method of claim 11, wherein the step of determining the program state comprises determining a leakage current of the FinFET fuse.

14. The method of claim 11, wherein the step of determining the program state of the FinFET fuse comprises:
    providing a reference FinFET fuse;
    applying a gate voltage to the gate of the FinFET fuse and a gate of the reference FinFET fuse; and comparing generated voltages at the drain of the FinFET fuse and a drain of the reference FinFET fuse.

15. The method of claim 11, wherein the step of determining the program state of the FinFET fuse comprises:
applying a first voltage to the gate of the FinFET fuse, and a second voltage to the drain of the FinFET fuse, wherein the first voltage is greater than a threshold voltage of the FinFET fuse;
determining a drain current of the FinFET fuse; and
comparing the drain current with a pre-determined reference leakage current.

16. The method of claim 11, wherein the step of applying the program voltage comprises:
providing a charge pump; and
connecting the program voltage generated by the charge pump to the one of the source and the drain of the FinFET fuse.

17. The method of claim 11, wherein the step of applying the program voltage comprises:
providing an external pad coupled to the one of the source and the drain of the FinFET fuse; and
connecting the program voltage to the external pad.

18. An integrated circuit structure comprising:
a FinFET fuse array comprising a plurality of FinFET fuses arranged into rows and columns, wherein each of the FinFET fuses comprises a first source/drain region, a second source/drain region, and a gate;
a plurality of word lines extending in a row direction of the FinFET fuse array with each of the plurality of word lines connected to first source/drain regions of all the FinFET fuses in a same row;
a plurality of bit lines extending in a column direction of the FinFET fuse array with each of the plurality of bit lines connected to second source/drain regions of all the FinFET fuses in a same column; and
a plurality of read lines extending in the column direction with each of the plurality of read lines connected to gates of all the FinFET fuses in the same column.

19. The integrated circuit structure of claim 18, wherein the plurality of FinFET fuses comprises a first FinFET fuse having a channel region punched through.

20. The integrated circuit structure of claim 19, wherein the plurality of FinFET fuses comprises a second FinFET fuse having a channel region not punched through.

* * * * *